(12) United States Patent
Allen et al.

(10) Patent No.: US 8,334,088 B2
(45) Date of Patent: *Dec. 18, 2012

(54) FUNCTIONALIZED CARBOSILANE POLYMERS AND PHOTORESIST COMPOSITIONS CONTAINING THE SAME

(75) Inventors: Robert D. Allen, San Jose, CA (US); Matthew E. Colburn, Schenectady, NY (US); Daniel P. Sanders, San Jose, CA (US); Ratnam Sooriyakumaran, San Jose, CA (US); Hoa D. Truong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 45 days.

This patent is subject to a terminal disclaimer.

(21) Appl. No.: 12/938,459

(22) Filed: Nov. 3, 2010

(65) Prior Publication Data

US 2011/0045407 A1    Feb. 24, 2011

Related U.S. Application Data

(60) Division of application No. 12/057,478, filed on Mar. 28, 2008, now Pat. No. 7,883,828, which is a continuation of application No. 11/859,805, filed on Sep. 24, 2007, now abandoned.

(51) Int. Cl.
*G03F 7/038* (2006.01)
*G03F 7/039* (2006.01)

(52) U.S. Cl. .................. 430/270.1; 430/311; 430/325; 430/326; 430/905; 430/907; 430/919; 430/920; 430/921; 430/925

(58) Field of Classification Search .......... None
See application file for complete search history.

(56) References Cited

U.S. PATENT DOCUMENTS

| | | | |
|---|---|---|---|
| 4,731,605 A | 3/1988 | Nixon | |
| 5,939,236 A * | 8/1999 | Pavelchek et al. | 430/273.1 |
| 6,423,465 B1 | 7/2002 | Hawker et al. | |
| 6,660,230 B2 | 12/2003 | McGill et al. | |
| 6,908,185 B2 | 6/2005 | Chen et al. | |
| 7,157,052 B1 | 1/2007 | McGill et al. | |
| 7,172,849 B2 | 2/2007 | Babich et al. | |
| 7,648,820 B2 * | 1/2010 | Babich et al. | 430/313 |
| 7,824,845 B2 * | 11/2010 | Allen et al. | 430/326 |
| 7,883,828 B2 * | 2/2011 | Allen et al. | 430/270.1 |
| 2002/0197556 A1 | 12/2002 | Huang et al. | |
| 2003/0203306 A1 * | 10/2003 | Choi et al. | 430/270.1 |
| 2005/0042538 A1 | 2/2005 | Babich et al. | |
| 2005/0233254 A1 | 10/2005 | Hatakeyama et al. | |
| 2006/0063905 A1 | 3/2006 | Nakagawa et al. | |
| 2007/0003440 A1 | 1/2007 | McGill et al. | |
| 2007/0020467 A1 | 1/2007 | Nakagawa et al. | |
| 2007/0190461 A1 | 8/2007 | Ozaki et al. | |
| 2007/0254235 A1 | 11/2007 | Allen et al. | |

OTHER PUBLICATIONS

Birot, M. et al. "Comprehensive Chemistry of Polycarbosilanes, Polsilazene and Polycarbosilazene as Precursors for Ceramics", (1995) J. Chem. Rev. vol. 95, pp. 1443-1477.
French, Roger H. et al. "Second generation fluids for 193nm immersion lithography" Optical Microlithography XIX, (2006); Proc. of SPIE vol. 6154, pp. 615415-1 through 615415-7.
Interrante, L.V. et al. "Linear and Hyperbranched Polycarbosilanes with Si-CH2-Si Bridging Groups: A Synthetic Platform for the Construction of Novel Functional Polymeric Materials", Applied Organometallic Chemistry, (1998) vol. 12, pp. 695-705.
Rushkin, I.L. et al. "Synthesis of Poly(silylenemethylenes) through Reactions Carried Out on Preformed Polymers. 2. Investigation of the Hydrosilation Route to Substituted Poly(silylenemethylenes)"; Macromolecules 19986, vol. 29, pp. 5784-5787, supplemental pp. 1-11, (1986).
Sanders, Daniel P. et al., "Fluoroalcohol Materials with Tailored Interfacial Properties for Immersion Lithography", Advances in Resist Materials and Processing Technology XXIV, (2007) Proc. of SPIE vol. 6519, pp. 651904-1 through 651904-12.
Office Action—Notice of Abandonment for U.S. Appl. No. 11/859,805; Filing Date: Sep. 24, 2007; First Named Inventor: Robert D. Allen; Mail Date: Dec. 18, 2009.
Office Action—Notice of Allowance for U.S. Appl. No. 11/859,805; Filing Date: Sep. 24, 2007; First Named Inventor: Robert D. Allen; Mail Date: Sep. 2, 2009.
Office Action—Notice of Allowance for U.S. Appl. No. 12/057,478; Filing Date: Mar. 28, 2008; First Named Inventor: Robert D. Allen; Mail Date: Sep. 30, 2010.
Office Action—Non-Final for U.S. Appl. No. 11/859,804; Filing Date: Sep. 24, 2007; First Named Inventor: Robert D. Allen; Mail Date: Jan. 29, 2009.
Office Action—Non-Final for U.S. Appl. No. 11/859,805; Filing Date: Sep. 24, 2007; First Named Inventor: Robert D. Allen; Mail Date: Feb. 2, 2009.
Office Action—Non-Final for U.S. Appl. No. 12/057,478; Filing Date: Mar. 28, 2008; First Named Inventor: Robert D. Allen; Mail Date: Mar. 23, 2009.
Office Action—Non-Final for U.S. Appl. No. 12/057,478; Filing Date: Mar. 28, 2008; First Named Inventor: Robert D. Allen; Mail Date: Oct. 19, 2009.
Office Action—Notice of Abandonment for U.S. Appl. No. 11/859,804; Filing Date: Sep. 24, 2007; First Named Inventor: Robert D. Allen; Mail Date: Dec. 10, 2009.
Office Action—Supplemental Notice of Allowance for U.S. Appl. No. 11/859,804; Filing Date: Sep. 24, 2007; First Named Inventor: Robert D. Allen; Mail Date: Aug. 24, 2009.
Office Action—Restriction/Election for U.S. Appl. No. 12/057,478; Filgn Date Mar. 28, 2008, First Named Inventor: Robert D. Allen; Mail Date Oct. 31, 2008.
Office Action—Supplemental Notice of Allowance for U.S. Appl. No. 11/859,804; Filing Date: Sep. 24, 2007; First Named Inventor: Robert D. Allen; Mail Date: Oct. 20, 2009.
Office Action—Notice of Allowance—Supplemental for U.S. Appl. No. 11/859,805; Filing Date: Sep. 24, 2007; First Named Inventor: Robert D. Allen; Mail Date: Oct. 16, 2009.

* cited by examiner

*Primary Examiner* — Sin J. Lee

(74) *Attorney, Agent, or Firm* — Cantor Colburn LLP

(57) ABSTRACT

Linear or branched functionalized polycarbosilanes having an absorbance less than 3.0 $\mu m^{-1}$ at 193 nm and a relatively high refractive index are provided. The functionalized polycarbosilanes contain at least one pendant group that is acid labile or aqueous base soluble. Also disclosed are photoresists formulations containing the functionalized polycarbosilanes that are suitable for use in lithography, e.g., immersion lithography.

23 Claims, 2 Drawing Sheets

FUNCTIONALIZED CARBOSILANE POLYMERS AND PHOTORESIST COMPOSITIONS CONTAINING THE SAME

CROSS REFERENCE TO RELATED APPLICATIONS

This application is a divisional application of continuation application Ser. No. 12/057,478 filed Mar. 28, 2008 which is a continuation of non-provisional application Ser. No. 11/859,805; filed Sep. 24, 2007, the contents of which are incorporated by reference herein in their entirety.

BACKGROUND

This invention relates generally to functionalized carbosilane polymers and photoresist compositions containing the same.

Dry 193 nm resist materials are generally limited to indices of refraction near or below 1.7. It has been predicted that using a high refractive index resist in immersion lithography can significantly enhance the depth of focus, exposure latitude and mask error enhancement factor (MEEF) at numerical apertures (Nas)>1.0. The higher the refractive index, the greater the enhancements. It is expected that immersion lithography at 193-nm complemented by techniques such as double exposure would be the main lithography solution for 32-nm node manufacturing. This will place stringent requirements on 193-nm photoresists, among others.

Several polymers having a refractive index n as high as 1.9 have been identified as potential candidates. These materials include thioacrylates and thiazolines, but share the property of having a high sulfur content. Unfortunately, however, the 193-nm absorption of these polymers has also progressively increased with the increase in sulfur content and has made them unsuitable for photoresist applications. Some of the polymers that have been prepared for resist applications have absorbance values $[A=(\alpha_{10}/\mu m)]$ greater than 5.

A few functional polycarbosilanes have been reported previously. For, example, Interrante et. al., (I. L. Rushkin and L. V. Interrante, Macromolecules, 1996, 29, 5784) have reported the synthesis of several functional polycarbosilanes including a phenol containing polycarbosilane. The US patents and patent publications listed below have also reported the use of functional polycarbosilanes for various applications: U.S. Patent Publication No. 2005/0042538 to Babich et al.; U.S. Pat. No. 7,172,849 to Babich et al.; U.S. Pat. No. 6,660,230 to McGill et al.; U.S. Pat. No. 7,157,052 to McGill et al.; U.S. Patent Publication No 2007/0003440 to McGill et al.; U.S. Patent Publication No 2006/0063905 to Nakagawa et al.; and U.S. Patent Publication No. 2007/0020467 to Nakagawa et al.

Babich et al. describe polycarbosilanes with cross-linkable pendant groups for hard-mask applications. McGill et al. describe the use of fluoroalcohol containing polycarbosilanes for analytical and purification applications. Nakagawa et al. have reported the synthesis and utilization of polycarbosilanes for insulating films. None of the publications or patents mentioned above describes the use of polycarbosilanes for photoresist applications, or polycarbosilanes with acid functionalities. Furthermore, no report has attributed higher refractive index to polycarbosilanes.

Accordingly, there remains a need for high refractive index polymers suitable for use in photoresist compositions employed in immersion lithography.

SUMMARY

Exemplary embodiments include a linear or branched functionalized polycarbosilane having an acid labile functionality. The functionalized polycarbosilane can have a refractive index greater than 1.7 and an absorbance less than 3 per micrometer at 193 nanometers. In one embodiment, the functionalized polycarbosilane comprises carbosilane units of formula (I):

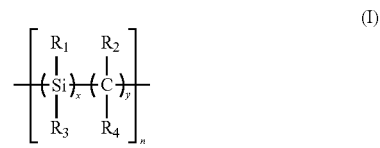

wherein $R_1$, $R_2$, $R_3$, and $R_4$ are independently selected from the group consisting of hydrogen, hydrocarbyl moiety, fluorocarbyl moiety, ethers, esters, lactones, groups containing sulfur, groups containing phosphorous, groups containing boron, groups containing silicon, groups containing germanium, groups containing polar functionalities, groups containing acid-labile functionalities, groups containing aqueous base soluble functionalities, groups containing cross linkable functionalities, and at least one polymer chain including a different polycarbosilane chain; and x, y, and n are integers independently $\geq 1$ with the proviso that at least one of $R_1$, $R_2$, $R_3$, and $R_4$ contain the acid-labile functionality.

Further exemplary embodiments include a photoresist composition comprising a photoacid generator; a linear or branched functionalized polycarbosilane having an acid-labile functionality and/or an aqueous soluble functionality; and a casting solvent.

Additional exemplary embodiments include a process of generating a resist image on a substrate, comprising coating a substrate with a film comprising a photoresist composition comprising a linear or branched functionalized carbosilane polymer having at least one acid labile functionality and/or an aqueous base soluble functionality; exposing the film selectively to a predetermined pattern of radiation so as to form a latent patterned image in the film; and developing the latent image with a developer to form the resist image.

Another exemplary embodiment includes a process for forming a multilayer structure, comprising forming a first layer of a planarizing material on a substrate; forming a second layer of a resist material on the first layer, wherein the resist layer comprises a linear or branched functionalized carbosilane polymer having at least one acid labile functionality and/or an aqueous base soluble functionality; patternwise exposing the second layer to radiation using a patterning tool; and developing a pattern in the second layer to remove unexposed portions of the second layer and to form a patterned resist that reveals portions of the first layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

Figure 1:
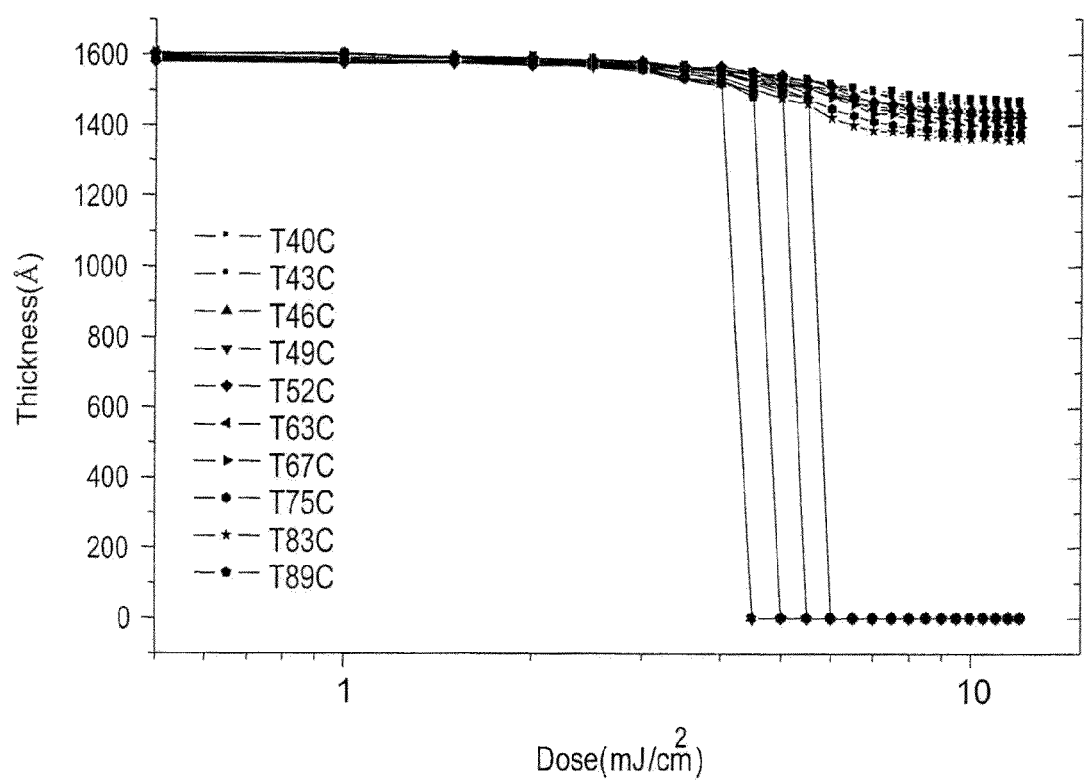
FIG. 1 graphically illustrates contrast curves as a function of temperature for a photoresist composition that included a functionalized polycarbosilane.

The detailed description explains the preferred embodiments of the invention, together with advantages and features, by way of example with reference to the drawings.

DETAILED DESCRIPTION

As used herein, the term "alkylene" as used herein refers to a difunctional linear or branched saturated hydrocarbon linkage, typically although not necessarily containing 1 to about 24 carbon atoms, such as methylene, ethylene, n-propylene, n-butylene, n-hexylene, decylene, tetradecylene, hexadecylene, and the like. Preferred alkylene linkages contain 1 to about 12 carbon atoms, and the term "lower alkylene" refers to an alkylene linkage of 1 to 6 carbon atoms, preferably 1 to 4 carbon atoms. The term "substituted alkylene" refers to an alkylene linkage substituted with one or more substituent groups, i.e., wherein a hydrogen atom is replaced with a non-hydrogen substituent group. If not otherwise indicated, the terms "alkylene" and "lower alkylene" include linear, branched, cyclic, unsubstituted, substituted, and/or heteroatom-containing alkylene and lower alkylene, respectively.

Unless otherwise indicated, the term "hydrocarbyl" is to be interpreted as including substituted and/or heteroatom-containing hydrocarbyl moieties. "Hydrocarbyl" refers to univalent hydrocarbyl radicals containing 1 to about 30 carbon atoms, preferably 1 to about 18 carbon atoms, most preferably 1 to about 12 carbon atoms, including linear, branched, cyclic, alicyclic, and aromatic species.

The present invention provides functionalized carbosilane polymers and photoresist compositions containing the same. Also disclosed are processes for generating a relief image using the photoresist compositions. The functionalized carbosilane polymers, also referred to herein as functionalized polycarbosilane polymers, are configured to have a high refractive index (n>1.7) and absorbance at 193 nm that is relatively low (A<3.00 µm$^{-1}$) rendering them suitable for use in photoresist compositions. Especially advantageous is the use of the functionalized carbosilane polymers in photoresist compositions for immersion lithography.

The functionalized carbosilane polymers (also referred to herein as functionalized polycarbosilane) comprise carbosilane units of the general formula (I).

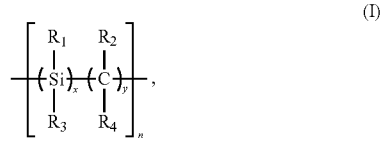

(I)

wherein $R_1$, $R_2$, $R_3$, and $R_4$ are independently selected from hydrogen, hydrocarbon moiety, fluorocarbon moiety, ethers, esters, groups containing sulfur, groups containing phosphorous, groups containing boron, groups containing polar functionalities, groups containing acid-labile functionalities, groups containing aqueous base soluble functionalities, groups containing cross linkable functionalities, or one or more polymer chains including a different polycarbosilane chain; and x, y, and n are independently > or =1 with the proviso that at least one of $R_1$, $R_2$, $R_3$, and $R_4$ contain an acid-labile functionality or an aqueous base soluble functionality.

The carbosilane polymer is not intended to be limited to any particular type and can be random, block, alternating or the like. Random polymers have a random sequence of monomer residue types; block polymers have two or more homopolymer subunits linked by covalent bonds; and alternating polymers possess regularly alternating monomer residues. Likewise, the carbosilane can be a homopolymer or a heteropolymer having two or more monomeric species such as copolymer, a terpolymer, a tetrapolymer, and any higher order polymer. Still further, the carbosilane polymer may be linear, or branched.

As will be discussed in greater detail below, the carbosilane polymer may initially be base soluble or become base soluble after irradiation by virtue of acid-catalyzed deprotection of acid-labile protecting groups.

Suitable acid-labile functionalities (i.e., acid-labile pendant groups) include, but are not limited to, esters, acetals, ketals, carbonates, and the like. The functionalized polycarbosilanes can include one or more of the acid labile functionalities, which can be the same or different. Suitable acid-labile functionalities are of the general formulae (II), (III), and (IV).

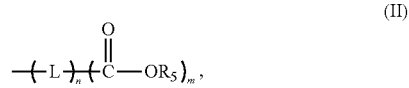

(II)

wherein L is a linking group selected from the group consisting of linear, branched, or substituted alkylene having 1 to 7 carbon atoms, cycloalkylene having 3 to 17 carbon atoms, alkylcycloalkylene having 4 to 20 carbon atoms, a cycloalkylalkylene having 4 to 20 carbon atoms, and combinations thereof; n=0 or 1; $R_5$ is selected from the group consisting of hydrocarbyl substituents with a tertiary carbon attachment point, acetal, or ketal; and m=1 or >1.

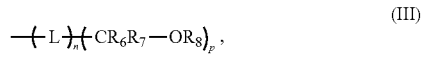

(III)

whereas, L is a linking group selected from the group consisting of linear, branched, or substituted alkylene having 1 to 7 carbon atoms, cycloalkylene having 3 to 17 carbon atoms, alkylcycloalkylene having 4 to 20 carbon atoms, a cycloalkylalkylene having 4 to 20 carbon atoms, and combinations thereof; n=0 or 1; $R_6$, $R_7$ are independently selected from hydrogen, $C_1$ to $C_6$ alkyl (e.g., methyl, ethyl, isopropyl, etc.), fluorinated $C_1$ to $C_6$ alkyl groups; $R_8$ is selected from the group consisting of hydrocarbyl substituents with a tertiary carbon attachment point, acetal, or ketal; and p=1 or >1.

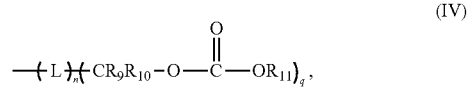

(IV)

wherein L is a linking group selected from the group consisting of linear, branched, or substituted alkylene having 1 to 7 carbon atoms, cycloalkylene having 3 to 17 carbon atoms, alkylcycloalkylene having 4 to 20 carbon atoms, a cycloalkylalkylene having 4 to 20 carbon atoms, and combinations thereof; n=0 or 1; $R_9$, $R_{10}$ are independently selected from hydrogen, $C_1$ to $C_6$ alkyl (e.g., methyl, ethyl, isopropyl, etc.), fluorinated $C_1$ to $C_6$ alkyl groups; $R_{11}$ is selected from the groups consisting of hydrocarbyl substituents with a tertiary carbon attachment point; and q=1 or >1.

Preferred hydrocarbyl substituents with teriary attachement point include, but are not limited to, t-butyl group, 1-methyl-cyclopentyl group, 2-methyl-2-adamantyl group, 1-ethyl-1-cyclopentyl group, or 1-ethyl-1-cyclooctyl group.

Preferred acetal groups include, but are not limited to, 1-ethoxyethyl group, tetrahydrofuranyl group, or tetrahydropyranyl group.

Preferred ketal groups include, but are not limited to, 1-methoxy-1-cyclohexyl group, 4-methyl-4-hydroxybutyric acid lactone (α-angelicalactone derivative).

Other suitable acid-labile protecting groups may be found in U.S. Pat. No. 5,679,495 to Yamachika et al. or in the pertinent literature and texts (e.g., Greene et. al., Protective Groups in Organic Synthesis, 2$^{nd}$ Ed. (New York: John Wiley & Sons, 1991)).

Preferred acid-labile functionalities have the structural formula (II), which undergo a cleavage reaction in the presence of photogenerated acid to generate a carboxylic acid group. Typically, the reaction of acid-labile functional groups with photogenerated acid occurs only, or is promoted greatly by, the application of heat to the film. Those skilled in the art will recognize the various factors that influence the rate and ultimate degree of cleavage of acid-labile functional groups as well as the issues surrounding integration of the cleavage step into a viable manufacturing process. The product of the cleavage reaction is a polymer-bound carboxylic acid group, which, when present in sufficient quantities along the polymer backbone, imparts solubility to the polymer in basic aqueous solutions.

Suitable aqueous base soluble functionalities include, without limitation, acidic functionalities such as a fluorinated alkyl sulfonamide, a carboxylic acid, a phenol, and a fluoroalcohol.

Suitable non-acidic polar functionalities include, but are not limited to, lactones, anhydrides, alkylsulfonamides, nitriles, and alcohols.

Suitable cross linking functionalities include, but are not limited to, any aliphatic or aromatic group that has a pendant hydrogen bonding functionality or a pendant cross-linkable functionality. Hydrogen bonding functionality includes hydroxyl, amido, keto, carboxylate, carboxylic acid, alkoxy, sulfonic acid, silanol, thiol, amino, and the like. Cross-linkable functionality also is intended to include epoxy group, oxetane, styrene, siloxane, furfuryl group, tetrahydrofurfuryl group and the like.

The functionalized polycarbosilanes can be prepared via a well known hydrosilation reaction scheme as is generally illustrated in reaction scheme (I) using poly(carbomethylsilane) precursors as shown below:

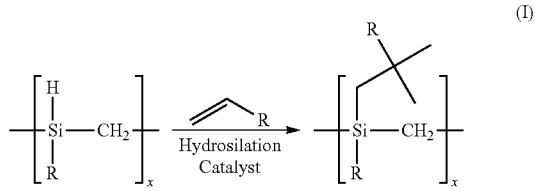

(I)

Using this method, numerous functionalized polycarbosilanes with higher refractive indices (n>1.7) and relatively low absorbance (A<3.00 µm$^{-1}$) at 193 nm have been prepared that are suitable for use in photoresist compositions. (See the examples below.) A detailed description of the above reaction scheme may be found, for example, in R. D. Archer, *Inorganic and Organometallic Polymers*, 54 76 (2001); M. A. Brook, *Silicon in Organic and Organometallic, and Polymer Chemistry*, 256-367, 400, (2000); M. Birot et al., *Comprehensive Chemistry of Polycarbosilanes, Polsilazene, and Polycarbosilazene as Precursors for Ceramics*, 95 J. Chem. Rev. 1443 (1995); and L. V. Interrante et al., *Linear and Hyperbranched Polycarbosilanes with Si—CH$_2$—Si Bridging Groups. A Synthetic Platform for the Construction of Novel Polymeric Materials*, 12 Appl. Organometal. Chem. 695 (1998).

The photoresist compositions including the functionalized carbosilanes generally comprise an acid generator and a casting solvent. The acid generator can be a photoacid generator. Upon exposure to activating radiation, the acid generator generates a strong acid.

The photosensitive acid generators (PAGs) used in the resist compositions of the invention may be any suitable photosensitive acid generator known in the resist art, which is otherwise compatible with the other selected components of the resist composition, and in particular, for positive resist compositions. Examples of preferred photosensitive acid generators (PAG) include: (trifluoromethylsulfonyloxy)-bicyclo [2.2.1]hept-5-ene-2,3-dicarboximide ("MDT"), (perfluorobutanesulfonyloxy) bicyclo[2.2.1]hept-5-ene-2,3-dicarboximide, onium salts, aromatic diazonium salts, sulfonium salts, diaryliodonium salts and sulfonic acid esters of N-hydroxyamides or -imides, as disclosed in U.S. Pat. No. 4,731,605. Also, a PAG that produces a weaker acid such as dodecane sulfonate of N-hydroxy-naphthalimide ("DDSN") may be used. Fluorinated PAG is also preferred for higher acidity (lower pK$_a$). Combinations of PAGs may be used.

The casting solvent generally serves to dissolve the other components so that the overall composition may be applied evenly on the substrate surface to provide a defect-free coating. Where the resist composition is used in a multilayer imaging process, the solvent used in the imaging layer resist is preferably not a solvent to the underlayer materials, otherwise the unwanted intermixing may occur. When the underlayer composition uses a crosslinker approach, a cross-linked underlayer will prevent intermixing. In this case, the same or a different solvent can be used for both the imaging layer and the underlayer. Examples of suitable casting solvents include, without limitation, cyclopentanone, cyclohexanone, lactate esters such as ethyl lactate, alkylene glycol alkyl ether esters such as propylene glycol methyl ether acetate, alkylene glycol monoalkyl esters such as methyl cellosolve, butyl acetate, 2-ethoxyethanol, and ethyl 3-ethoxypropionate, ethoxyethylpropionate ("EEP"), a combination of EEP and γ-butyrolactone ("GBL"), propylene-glycolmonoethylether acetate (PGMEA), and the like. The above list of solvents is for illustrative purposes only and should not be viewed as being comprehensive nor should the choice of solvent be viewed as limiting the invention in any way. Those skilled in the art will recognize that any number of solvents or solvent mixtures may be used.

The resist compositions may further include organic base additives, surfactants, sensitizers, dissolution modifying additives, additives intended to modify the contact angle of the resist surface for immersion lithography applications and to prevent PAG extraction by the immersion fluid (Sanders et al. *Proc. SPIE* 2006, 6519, 651904), or other expedients known in the art. The compositions of the present invention are not limited to any specific selection of these expedients.

Examples of base additives include dimethylamino pyridine, 7-diethylamino-4-methyl coumarin ("Coumarin 1"), tertiary amines, imidazoles, imides, amides, proton sponge, berberine, and the polymeric amines as in the PLURONIC® or TETRONIC® series from BASF. Tetraalkyl ammonium hydroxides or cetyltrimethyl ammonium hydroxide may be used as a base additive when the PAG is an onium salt.

Examples of possible surfactants include fluorine-containing surfactants such as the FLUORAD® series, preferably FC-430, and more preferably, FC-4430, both available from 3M Company in St. Paul, Minn., and siloxane-containing surfactants such as the SILWET® series available from Union Carbide Corporation in Danbury, Conn.

The resist compositions of the invention are not limited to any specific proportions of the various components. The resist composition of the present invention preferably includes about 0.1-25 wt. % PAG, more preferably about 0.5-15 wt. %, based on the total weight of imaging polymer in the composition. The inventive resist composition preferably contains about 0.02-8 wt. % of the base additive, more preferably about 0.1-2 wt. %, based on the total weight of the polymer. Where the resist compositions of the invention contain a solvent, the overall composition preferably contains about 50-98 wt. % solvent.

The resist compositions of the invention are useful in single layer photolithographic processes, and are especially useful as imaging layers in multilayer photolithographic processes, such as bi-layer or tri-layer processes. Preferably, the resist compositions of the invention may be patterned using various radiation types such as 365 nm wavelength, deep-UV (specifically 248 nm, 193 nm, and 157 nm wavelengths), extreme-UV (approximately 13 nm wavelength), x-ray, electron beam, and ion beam. This resist compositions may be patterned under immersion conditions under water or a high refractive index fluid (e.g., French et al. *Proc. SPIE* 2006, 6154, 6155) with or without an overcoat. The appropriate radiation type(s) may depend on the components of the overall resist composition (e.g., the selection of the polymer component, photosensitive acid generator (PAG), base (or quencher), additives, surfactant, solvent, etc.). The resist compositions of the invention generally provide high-resolution capability (approximately 100 nm resolution or less, more particularly below 70 nm) in combination with desired dissolution behavior.

The present invention encompasses a method of patterning a desired substrate, such as, for example, a silicon wafer, a chrome-on-glass mask blank, or a printed circuit board. The method includes applying to the substrate a coating of the photoresist composition containing the functionalized polycarbosilane polymer, as described above, to form a film. The photoresist material can be applied by known means, such as spin casting, immersion, and the like.

The method also includes patternwise exposing the photoresist composition to an imaging radiation source, such as ultraviolet radiation of 193 or 157 nm. In a preferred embodiment, the imaging radiation source is by immersion lithography at 193 nm. The areas of the photoresist exposed to the radiation source are then developed by, for example, immersion, puddle development, or other processes known to those skilled in the art. Developer solution can include, for example, dilute aqueous alkali solution, which may or may not contain a surfactant.

In the case of positive tone photoresists, the exposed areas of the film will be rendered soluble in the developer and can be washed away, leaving a pattern of the unexposed areas. In negative tone photoresists, the exposed areas of the film will be rendered insoluble and will remain after development of the unexposed areas. The developed image can then be rinsed with water to remove excess developer and dried. The patterned photoresist image can then be used as an etch mask for subsequent image transfer into the underlying substrate.

When the photoresist composition is to be used as a negative photoresist, a crosslinking agent may be added to the photoresist composition for example, during resist formulation, and/or the polycarbosilane can be functionalized with a crosslinking functionality. Examples of such crosslinking agents that can be added include, but are not limited to, glycouril, melamine, epoxide, furyl, tetrahydrofuryl, vinyl ether, oxetane and combinations thereof. One particular example of a suitable glycouril is POWDERLINK® 1174 available from Cytec (West Paterson, N.J.). Suitable crosslinking functionalities were described above.

Pre-application, post-application, post-exposure, and post-development processes such as, for example, application of an anti-reflective coating, substrate priming, baking, flood exposure, or vapor treatment, may also be incorporated into the methodologies of the invention at least in part to enhance the performance and/or advantages of the present invention, as is known in the art. In particular, the incorporation of a post-application bake (PAB) to remove residual casting solvent of the photoresist film can be desirable in some applications. A PAB process may include baking the desired substrate (e.g., wafer), at a temperature of about room temperature (about 21° C.) to about 120° C. for a period of about 10 seconds to about 120 seconds.

Additionally, it may be desirable to include a post-exposure bake (PEB) in a manner consistent with the PAB methodology described above. Although it is not necessary for performance of many low activation energy chemically amplified photoresists (e.g., ketal or acetal functionalized polycarbosilanes), a PEB may be included to enhance lithographic imaging quality. A PEB process may include baking the wafer or substrate at a temperature of about room temperature (about 21° C.) to about 120° C. for a period of about 10 seconds to about 120 seconds. It is to be appreciated that both PAB and PEB processes may be accomplished using conventional methods understood by those skilled in the art, such as, for example, contact hot plate baking, oven baking, proximity baking, and the like. It may also be desirable to incorporate prior treatment of the substrate with a surface priming agent including, but not limited to, conventional silylating agents such as, for example, hexamethyldisilazane and/or related species by techniques known to those skilled in the art. Illustrative techniques suitable for use with the present invention include, without limitation, vapor priming and liquid puddle application.

The method can further include etching the patterned substrate using a conventional etching process that may include, but is not limited to, a reactive ion etch. In addition any remaining photoresist composition can be removed from the substrate, for example, using a stripping agent.

The present invention encompasses a single layer method of forming a structure on a substrate, including providing a substrate; applying the resist composition to the substrate to form a resist layer on the substrate, wherein the resist composition includes a functionalized polycarbosilane polymer as described above, and a photoacid generator; patternwise exposing the substrate to radiation, whereby acid is generated by the radiation-sensitive acid generator in exposed regions of the resist layer; removing patternwise soluble portions of the resist layer to form a pattern of spaces in the resist layer; and transferring the pattern of spaces to the substrate. As noted above, the resist formulation can be configured to be a negative tone resist or a positive tone resist.

The exposed resist layer may be baked to promote an acid-catalyzed reaction in exposed portions of the resist layer. The substrate may include a material layer to be patterned, and the method may further include a step of transferring the pattern of spaces in the resist layer to the underlying substrate by removing portions of the material layer through the pattern of spaces in the resist layer. Alternatively, the method may include a step of transferring the pattern of spaces in the resist layer to the underlying substrate material (which may include one or more layers of material) by depositing a material (such as an organic dielectric, a metal, a ceramic or a semiconductor) onto the substrate at the spaces in the resist layer, or by implanting dopants into the substrate material. The substrate may include any suitable material useful in the formation of microelectronic structures, and is preferably selected from any of an organic dielectric, a metal, a ceramic or a semiconductor.

The invention also encompasses a multilayer (e.g., bi-layer or tri-layer) lithography method including forming a first layer of a planarizing material on a substrate; forming a second (imaging) layer of a resist material on the first layer, wherein the second layer includes a resist composition of the invention; pattern-wise exposing the second layer to radiation using a patterning tool, optionally followed by post-exposure baking (PEB); and developing a pattern in the second layer to remove unexposed portions of the second layer and to form a patterned resist that reveals portions of the first layer. As in a single layer method, the multilayer method may further include transferring the pattern of spaces in the resist by any conventional method such as depositing, implanting or etching.

Preferably, the first layer is a planarizing underlayer that is highly energy absorbing, and/or reduces reflection to the imaging resist layer. The planarizing underlayer is preferably applied directly over the material layer to be patterned. Subsequently, a layer of the inventive resist composition is applied over the first planarizing underlayer, using spin coating or other techniques. The resist coating is preferably as thin as possible (generally less than 100 nm) provided that the thickness is preferably substantially uniform and that the resist layer is sufficient to withstand subsequent processing (typically reactive ion etching (RIE)) to transfer the lithographic pattern to the planarizing underlayer. Optionally, the substrate with the resist coating may be heated (pre-exposure bake or post-apply bake (PAB)) to remove the solvent and improve the coherence of the resist layer. The PAB step is preferably conducted for about 10 seconds to about 15 minutes, more preferably about 15 seconds to about two minutes. The PAB temperature may vary depending on the $T_g$ of the resist. Optionally, the functionalized carbosilane photoresist composition, once coated, may further include an overcoat to provide, for example, protection of the lens from photoacid or photoacid generators that may diffuse into the liquid medium during immersion lithography, for example. Optionally, a suitably designed additive added to the resist may segregate to the surface and act as an in-situ overcoat.

The resist pattern is then patternwise exposed to the desired radiation (e.g., 193 nm, 157 nm radiation). Where scanning particle beams, such as electron beam, are used, patternwise exposure may be achieved by scanning the beam across the substrate and selectively applying the beam in the desired pattern. More typically, wavelike radiation, such as 193 nm or 157 nm UV radiation, is projected through a mask to provide patternwise radiation exposure to the resist. Preferably, the resist image formed in the second layer is a high resolution resist image. Resolution enhancement techniques (RET), such as attenuated phase shift (attPSM), or alternating phase-shift (altPSM) masks or other RET methodologies, may be used as the radiation wavelengths decrease.

Optionally, the patternwise exposed resist layer may be baked (post-exposure bake or PEB) between the exposure and developing steps to further complete the acid-catalyzed reaction, to facilitate the deprotection of acid labile groups in the radiation-exposed portions of the resist layer and to enhance the contrast of the exposed pattern. The PEB is preferably conducted at about 20-120° C. The PEB is preferably conducted for about 10 seconds to 5 minutes.

The resist structure with the desired pattern is obtained by contacting the resist layer with an alkaline solution that selectively dissolves the areas of the resist, which were exposed to radiation. Preferred alkaline solutions (developers) are aqueous solutions of tetramethyl ammonium hydroxide (TMAH). Preferably, the step of developing the second layer uses an aqueous solution of TMAH of about 0.14 N or greater, about 0.20 N or greater in some embodiments, and about 0.26 N or greater in still other embodiments. The resulting lithographic structure on the substrate is then typically dried to remove any remaining developer solvent.

The portions of the first planarizing underlayer are preferably removed by etching using remaining portions of the patterned second layer as a mask. Preferably, the etching is performed by $O_2$ plasma reactive ion etching (RIE) or other anisotropic etching techniques. Once the desired portions of the underlayer have been removed, the pattern may be transferred to portions of the substrate, for example, by etching (e.g., by reactive ion etching) the substrate at positions corresponding to the removed portions of the underlayer. Once the desired pattern transfer has taken place, any remaining underlayer and resist may be removed by using conventional stripping techniques.

The planarizing underlayer should be sufficiently etchable, selective to the overlying resist (to yield a good profile in the etched underlayer) while being resistant to the etch process needed to pattern the underlying material layer (substrate). Additionally, the planarizing underlayer composition should have the desired optical characteristics (e.g., refractive index, optical density, etc.) such that the need for any additional antireflective coating (ARC) layer is avoided. The planarizing underlayer composition should also have physical/chemical compatibility with the imaging resist layer to avoid unwanted interactions which may cause footing and/or scumming.

The following non-limiting examples are presented to better illustrate the present disclosure. In the following examples, the polycarbosilane starting materials, e.g., poly(carbomethylsilane), were obtained from Aldrich Chemical Company and Starfire Systems Inc. Aldrich polymers are solids and our analysis by NMR spectroscopy indicated that these polymers are highly branched and may contain Si—Si units. The polymer obtained from Starfire systems was a viscous liquid and had a broad polydispersity as determined by Gel Permeation Chromatography (GPC).

Where appropriate, the following techniques and equipment were utilized in the Examples: $^1H$ and $^{13}C$ NMR spectra were obtained at room temperature on an Avance 400 spectrometer. Quantitative $^{13}C$ NMR was run at room temperature in an inverse-gated $^1H$-decoupled mode using $Cr(acac)_3$ as a relaxation agent on an Avance 400 spectrometer. For polymer composition analysis $^{19}F$ NMR (379 MHz) spectra were also obtained using a Bruker Avance 400 spectrometer. Thermogravimetric analysis (TGA) was performed at a heating rate of 5° C./min in $N_2$ on a TA Instrument Hi-Res TGA 2950 Thermo-gravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Film thickness was measured on a Tencor alpha-step 2000. A quartz crystal microbalance (QCM) was used to study the dissolution kinetics of the resist films in an aqueous tetramethylammonium hydroxide (TMAH) solution (CD-26).

The 193 nm dry exposures were carried out on an ISI mini-stepper with 0.60 NA. Immersion exposures were carried out on a 193 nm interferometric tool assembled in-house. E-beam exposures were carried out on a Leica 100 kV exposure tool.

The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations. Unless indicated otherwise, parts are parts by weight, temperature is in ° C. and pressure is at or near atmospheric. Additionally, all starting materials were obtained commercially or were synthesized using known procedures.

EXAMPLES

Example 1

Allylmalonic acid di-tetrahydropyranyl ester was prepared. Allylmalonic acid (7.21 grams, 0.05 mole), 3,4-dihydro-2H-pyran (16.82 g, 0.20 mole), and dichloromethane (50 ml) were placed in a round bottom flask equipped with a magnetic stirrer, nitrogen inlet, and a water condenser. Pyridine p-toluenesulfonate (300 mg) was added to this mixture and stirred at room temperature for 3 hours. According to the IR spectrum of the reaction product, the reaction was complete. The reaction mixture was washed with 2×100 ml saturated sodium bicarbonate solution followed by 100 ml brine and was dried over anhydrous magnesium sulfate. The volatiles were removed in a rotary evaporator and the residue was dried under vacuum at room temperature. The NMR spectrum of the residue indicated that it contained only the desired product.

Example 2

In this example, poly(carbomethylsilane) partially substituted with propylmalonic acid di-tetrahydropyranyl ester of formula (V) was prepared from the allylmalonic acid di-tetrahydropyranyl ester produced in accordance with Example 1.

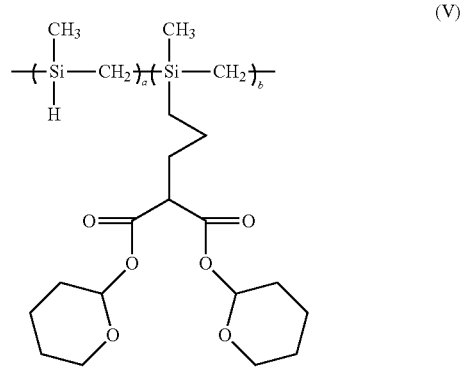

(V)

Polycarbomethylsilane (Aldrich, $M_w$~800) (1.16 g), allylmalonic acid di-tetrahydropyranyl ester (4.68 g, 0.015 mole), and tetrahydrofuran (THF) (5 ml) were placed in a round bottom flask equipped with a magnetic stirrer, nitrogen inlet, and a water condenser. Platinum(0)-1,3-divinyl-1,1,3,3-tetramethyldisiloxane complex in xylene (0.25 ml) was added to this mixture and heated at 80-90° C. for 2 hours. Afterwards, another portion of the catalyst, platinum(0)-1,3-divinyl-1,1,3,3-tetramethyldisiloxane complex in xylene (0.25 ml), was added and heated at 80-90° for 2 more hours. The solution was allowed to cool to room temperature and added drop wise into 200 ml HFE-7100 (Ultra Pure Solutions, Inc.). The precipitated polymer was filtered through a frit funnel and dried under vacuum at room temperature for 72 hours. Yield: 0.60 grams. $M_w$=4848, PDI=1.65 and (a:b is approximately 1:1). NMR data indicated that about 50% of the hydrogen had been substituted. Refractive Index=1.82, Absorbance=1.99/micrometer.

Example 3

In this example, allylmalonic acid di-α-methyl-γ-butyrolactone ester was prepared. Allylmalonic acid (7.21 grams, 0.05 mole), α-angelicalactone (16.82 g, 0.20 mole), and dichloromethane (50 ml) were placed in a round bottom flask equipped with a magnetic stirrer, nitrogen inlet, and a water condenser. Pyridine p-toluenesulfonate (300 mg) was added to this mixture and heated to reflux for 19 hours. According to the IR spectrum of the reaction product, the reaction was complete. The reaction mixture was washed with 2×100 ml saturated sodium bicarbonate solution followed by 100 ml brine and was dried over anhydrous magnesium sulfate. The volatiles were removed at 40° C. under high vacuum. The NMR spectrum of the residue indicated that it contained only the desired product.

Example 4

In this example, polycarbomethylsilane partially substituted with propylmalonic acid di-α-methyl-γ-butyrolactone ester of formula (VI) was prepared from the allylmalonic acid di-α-methyl-γ-butyrolactone ester produced in accordance with Example 3.

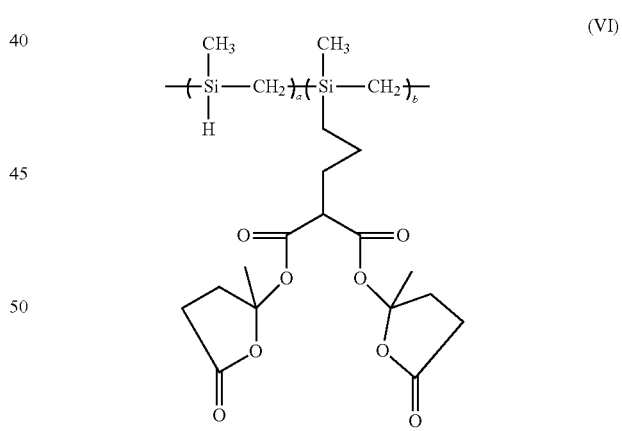

(VI)

Polycarbomethylsilane (Aldrich, $M_w$~800) (1.16 g), Allylmalonic acid di-α-methyl-γ-butyrolactone ester (5.10 g, 0.015 mole), and tetrahydrofuran (THF) (10 ml) were placed in a round bottom flask equipped with a magnetic stirrer, nitrogen inlet, and a water condenser. Platinum(0)-1,3-divinyl-1,1,3,3-tetramethyldisiloxane complex in xylene (0.50 ml) was added to this mixture and heated at 80-90° for 3 hours. Afterwards, another portion of the catalyst, platinum (0)-1,3-divinyl-1,1,3,3-tetramethyldisiloxane complex in xylene (0.25 ml), was added and heated at 80-90° C. for 2 more hours. The solution was allowed to cool to room temperature and added drop wise into 200 ml HFE-7100. The precipitated polymer was separated by decantation and dried under vacuum at 50° C. for 15 hours. The sticky polymer was dissolved in 20 ml acetone and added drop wise into 400 ml hexanes and the precipitated polymer was separated by decantation. This polymer was dried under vacuum at 50° C. for 15 hours. Yield: 1.30 grams. $M_w$=6476, PDI=1.8, Refractive Index=1.80, Absorbance=1.35/micrometer. NMR data indicated that about 50% of the hydrogen had been substituted (a:b~1:1).

Example 5

In this example, polycarbomethylsilane partially substituted with 1-methylcyclopentyl-2-norbornanecarboxylate of formula (VII) was prepared.

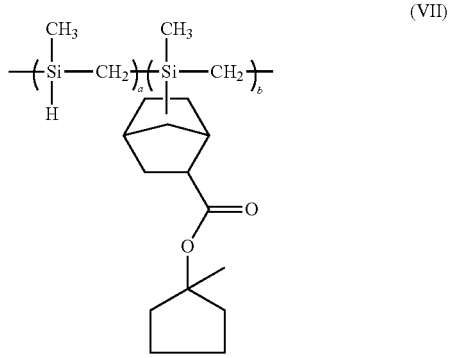

(VII)

Polycarbomethylsilane (Aldrich, $M_w$~800) (2.32 g) and 1-methylcyclopentyl-5-norbornene-2-carboxylate (17.65 g, 0.08 mole) were placed in a round bottom flask equipped with a magnetic stirrer, nitrogen inlet, and a water condenser. Platinum(0)-1,3-divinyl-1,1,3,3-tetramethyldisiloxane complex in xylene (0.50 ml) was added to this mixture and heated at 80-90° C. for 22 hours. The solution was allowed to cool to room temperature and added drop wise into 300 ml methanol. The precipitated polymer was filtered through a frit funnel. According to NMR spectra of the polymer, some monomer remained. This polymer was dissolved in 12.5 ml of tetrahydrofuran and precipitated again into 250 ml methanol. It was filtered through a frit funnel and dried under vacuum at 60° C. for 15 hours. Yield: 1.73 grams. $M_w$=3546, PDI=1.6, Refractive Index=1.83, Absorbance=2.37/micrometer. NMR data indicated that about 50% of the hydrogen had been substituted (a:b~1:1).

Example 6

In this example, polycarbomethylsilane partially substituted with 1,1,1-trifluoro-2-trifluoromethyl-2-hydroxypentane of formula (VIII) was prepared.

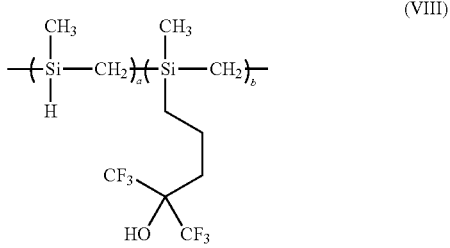

(VIII)

Polycarbomethylsilane (Aldrich, $M_w$~800) (2.32 g) and 1,1,1-trifluoro-2-trifluoromethyl-4-penten-2-ol (16.64 g, 0.08 mole) were placed in a round bottom flask equipped with a magnetic stirrer, nitrogen inlet, and a water condenser. Platinum(0)-1,3-divinyl-1,1,3,3-tetramethyldisiloxane complex in xylene (0.50 ml) was added to this mixture and heated at 80-90° C. for 23 hours. The unreacted monomer was removed in a rotary evaporator and then dried under vacuum at 60° C. for 15 hours. Yield: 3.54 grams. $M_w$=4074, PDI=2.06, Refractive Index=1.75, Absorbance=1.67/micrometer. NMR data indicated that about 50% of the hydrogen had been substituted (a:b~1:1).

Example 7

In this example, polycarbomethylsilane partially substituted with 1-methylcyclopentyl-2-norbornanecarboxylate and norbornane spiroactone of formula (IX) was prepared.

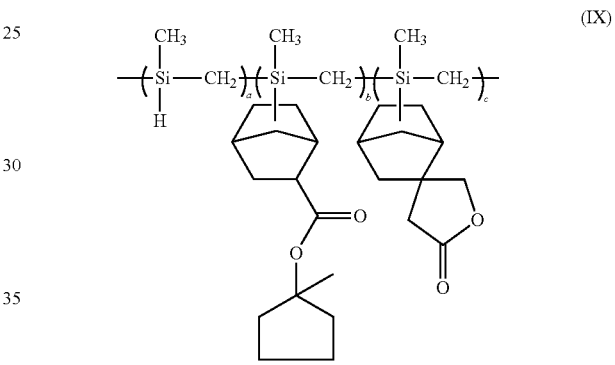

(IX)

Polycarbomethylsilane, (Aldrich, $M_w$~800) (2.32 g), 1-methylcyclopentyl-5-norbornene-2-carboxylate (8.82 g, 0.04 mole), and norbornene spiroactone (6.56 g, 0.04 mole) were placed in a round bottom flask equipped with a magnetic stirrer, nitrogen inlet, and a water condenser. Platinum(0)-1, 3-divinyl-1,1,3,3-tetramethyldisiloxane complex in xylene (0.50 ml) was added to this mixture and heated at 80-90° C. for 21 hours. The viscous solution was allowed to cool to room temperature and diluted with 10 ml tetrahydrofuran. This solution was added drop wise into 500 ml methanol. The precipitated polymer was filtered through a frit funnel. According to proton NMR spectrum of the polymer, some monomer remained. This polymer was dissolved in 10 ml of tetrahydrofuran and precipitated again into 100 ml methanol. It was filtered through a frit funnel and dried under vacuum at 60° C. for 15 hours. Yield: 1.00 gram. $M_w$=4340, PDI=1.54, Refractive index=1.85, Absorbance=2.63/micrometer. NMR data indicated that about 50% of the hydrogen had been substituted (a:b:c~1.0:0.5:0.5).

Example 8

In this example, polycarbomethylsilane partially substituted with 2-Trifluoromethanesulfonylaminomethyl norbornane of formula (X) was prepared.

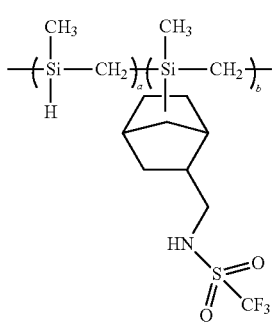

(X)

Polycarbomethylsilane (Aldrich, $M_w$~800) (1.16 g) and 2-trifluoromethane-sulfonylaminomethyl norbornene (5.42 g, 0.02 mole) were placed in a round bottom flask equipped with a magnetic stirrer, nitrogen inlet, and a water condenser. Platinum(0)-1,3-divinyl-1,1,3,3-tetramethyldisiloxane complex in xylene (0.30 ml) was added to this mixture and heated at 80-90° C. for 18 hours. The solution was allowed to cool to room temperature and added drop wise into a mixture of 300 ml methanol and 100 ml deionized water. The precipitated polymer was filtered through a frit funnel and washed with 2×50 ml methanol/water mixture (4:1) and dried under vacuum at 60° C. for 15 hours. Yield: 1.40 grams. $M_w$=4421, PDI=2.0, Refractive Index=1.77, Absorbance=2.17/micrometer. NMR data indicated that about 50% of the hydrogen had been substituted (a:b~1:1).

Example 9

In this example, polycarbomethylsilane partially substituted with norbornanedicarboxylic anhydride and 1-methylcyclopentyl-2-norbornanecarboxylate of formula (XI) was prepared.

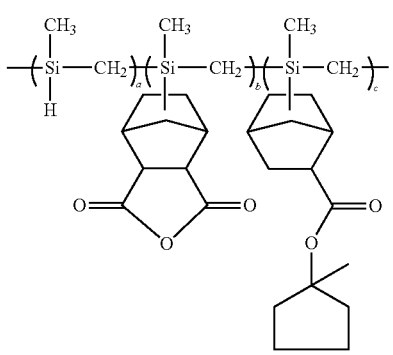

(XI)

Polycarbomethylsilane (commercially obtained from Starfire) (1.45 g), 1-methylcyclopentyl-5-norbornene-2-carboxylate (3.40 g, 0.015 mole), and cis-5-norbornene-endo-2,3-dicarboxylic anhydride (2.46 g, 0.015 mole), and 15 ml anhydrous tetrahydrofuran (THF) were placed in a round bottom flask equipped with a magnetic stirrer, nitrogen inlet, and a water condenser. Platinum(0)-1,3-divinyl-1,1,3,3-tetramethyldisiloxane complex in xylene (0.50 ml) was added to this mixture and heated at 80-90° C. for 2 hours. This solution was added drop wise into 300 ml methanol. The precipitated polymer was filtered through a frit funnel, washed with 2×100 ml methanol and dried under vacuum at 50° C. for 15 hours. Yield: 2.32 gram. $M_w$=120,557, PDI=22.81, Refractive Index=1.78, Absorbance=0.75/micrometer film. NMR data indicated that about 50% of the hydrogen had been substituted (a:b:c~1.0:0.5:0.5).

Example 10

Figure 2:
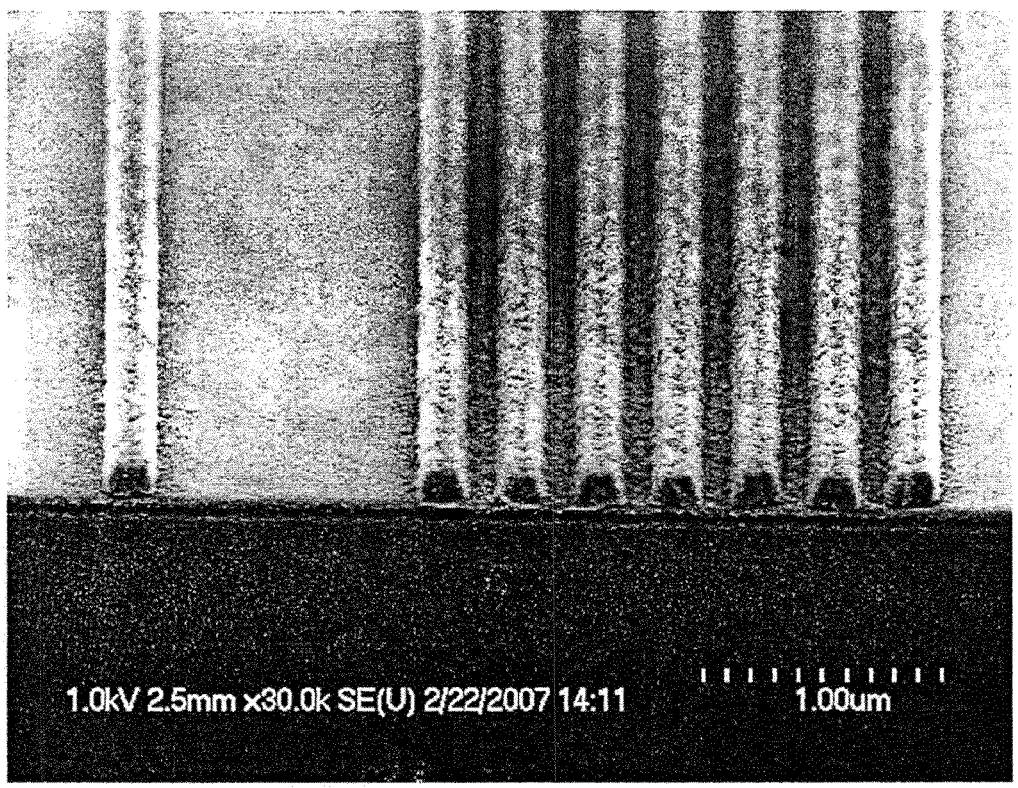
FIG. 2 pictorially illustrates a micrograph of a patterned photoresist composition that included a functionalized polycarbosilane.

In this example, a photoresist composition based on carbosilane polymer (VII) prepared in accordance with Example 2 was prepared. 0.5 g of the polymer, 20 mg of triphenylsulfonium perfluoro-1-butanesulfonate (photoacid generator), and 3.3 mg of an organic base were dissolved in 5 g of propylene glycol monomethyl ether acetate (PGMEA). This solution was filtered through a 0.2 micron syringe filter. Refractive Index=1.82, Absorbance=2.60/micrometer. FIG. 1 provides contrast curves as a function of temperature. FIG. 2 provides a micrograph of a patterned photoresist illustrating 170 nanometer dense and isolated lines. The photoresist was exposed using water at 193 nm with an exposure energy of 23.2 mJ/cm² and included a PEB at 60° C. for 60 seconds. Film thickness was 159 nanometers.

Advantageously, the functionalized carbosilane polymers provide refractive index greater than 1.7 and an absorbance less than 3.0. The photoresist compositions of the present invention are particularly useful as radiation-sensitive photoresists employed in the manufacture of electronic parts, especially semiconductor devices, or in the manufacture of photolithography masks using optical, electron beam, ion beam or x-ray radiation. Moreover, the compositions of the present invention may be employed for patterning printed circuit boards or photolithographic masks (i.e., photomasks), micromachining, the fabrication of microfluidic cells, or other related practices that require the definition of high-resolution patterns.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A photoresist composition comprising:
    a photoacid generator;
    a linear or branched functionalized polycarbosilane having an acid labile functionality and/or an aqueous base soluble functionality, wherein the functionalized polycarbosilane has a refractive index greater than 1.7 and an absorbance less than 3.0 μm$^{-1}$ at 193 nanometers; and
    a casting solvent.

2. The photoresist composition of claim 1, wherein the functionalized polycarbosilane comprises carbosilane units of formula (I):

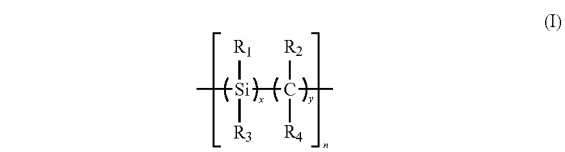

(I)

wherein $R_1$, $R_2$, $R_3$, and $R_4$ are independently selected from the group consisting of hydrogen, hydrocarbyl moiety, fluorocarbyl moiety, ethers, esters, lactones, groups containing sulfur, groups containing phosphorous, groups containing boron, groups containing silicon, groups containing germanium, groups containing polar functionalities, groups containing acid-labile functionalities, groups containing aqueous base soluble functionalities, groups containing cross linkable functionalities, and at least one polymer chain including a different polycarbosilane chain; and x, y, and n are independently >1 with the proviso that at least one of $R_1$, $R_2$, $R_3$, and $R_4$ contain the acid-labile functionality and/or the aqueous base soluble functionality.

3. The photoresist composition of claim 2, wherein y=2 and x=1.

4. The photoresist composition of claim 1, wherein the functionalized polycarbosilane is a homopolymer.

5. The photoresist composition of claim 1, wherein the functionalized polycarbosilane is a heteropolymer.

6. The photoresist composition of claim 1, wherein the functionalized polycarbosilane is a random, a block, or an alternating polymer.

7. The photoresist composition of claim 1, wherein the acid labile functionality comprises an ester moiety, an acetal moiety, a ketal moiety, a carbonate moiety, or a combination thereof.

8. The photoresist composition of claim 1, wherein the acid-labile functionality is given by at least one of the following:

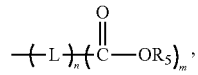
(II)

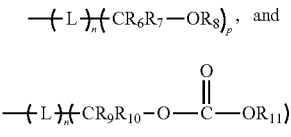
(III)

and (IV)

wherein L is a linking group selected from the group consisting of linear, branched, and substituted alkylenes having 1 to 7 carbon atoms, cycloalkylene having 3 to 17 carbon atoms, alkylcycloalkylene having 4 to 20 carbon atoms, a cycloalkylalkylene having 4 to 20 carbon atoms, and combinations thereof; n =0 or 1; $R_5$ is selected from the group consisting of hydrocarbyl substituents with a tertiary carbon attachment point, acetal, and ketal; $R_6$, $R_7$ are independently selected from hydrogen, $C_1$ to $C_6$ alkyl, fluorinated $C_1$ to $C_6$ alkyl groups; $R_8$ is selected from the group consisting of hydrocarbyl substituents with a tertiary carbon attachment point, acetal, and ketal; $R_9$, $R_{10}$ are independently selected from hydrogen, $C_1$ to $C_6$ alkyl, fluorinated $C_1$ to $C_6$ alkyl groups; $R_{11}$ is selected from the groups consisting of hydrocarbyl substituents with a tertiary carbon attachment point; $m \geq 1$; $p \geq 1$; and $q \geq 1$.

9. The photoresist composition of claim 8, wherein the acid-labile functionality is given by II.

10. The photoresist composition of claim 8, wherein the acid-labile functionality is given by III.

11. The photoresist composition of claim 8, wherein the acid-labile functionality is given by IV.

12. The photoresist composition of claim 1, wherein the photoacid generator is selected from the group consisting of (trifluoromethylsulfonyloxy)-bicyclo[2.2.1]hept-5-ene-2,3-dicarboximide ("MDT"), (perfluorobutanesulfonyloxy)-bicyclo [2.2.1]hept-5-ene-2,3-dicarboximide, onium salts, aromatic diazonium salts, sulfonium salts, diaryliodonium salts, sulfonic acid esters of N-hydroxyamides or -imides, and combinations thereof.

13. The photoresist composition of claim 1, wherein the functionalized polycarbosilane has a formula selected from the group consisting of:

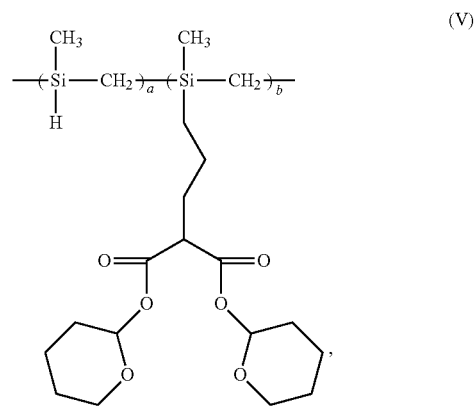
(V)

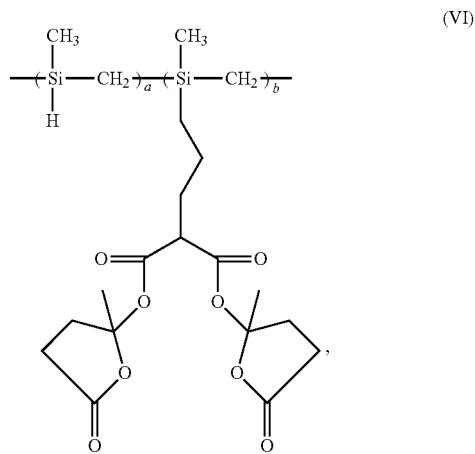
(VI)

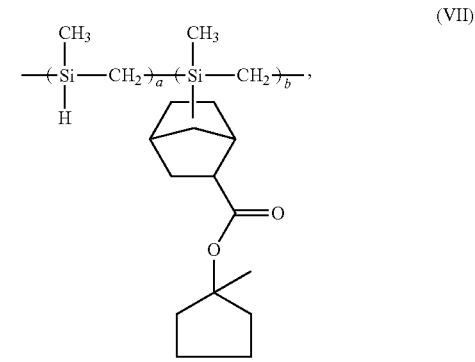
(VII)

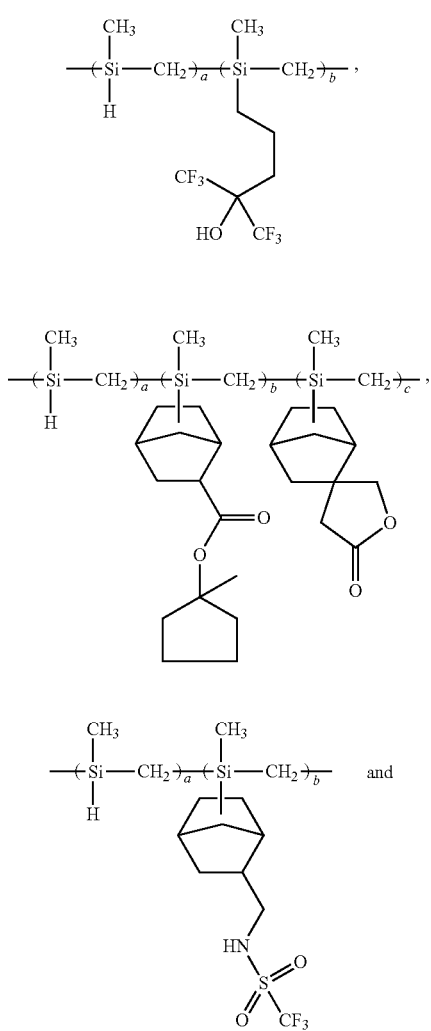

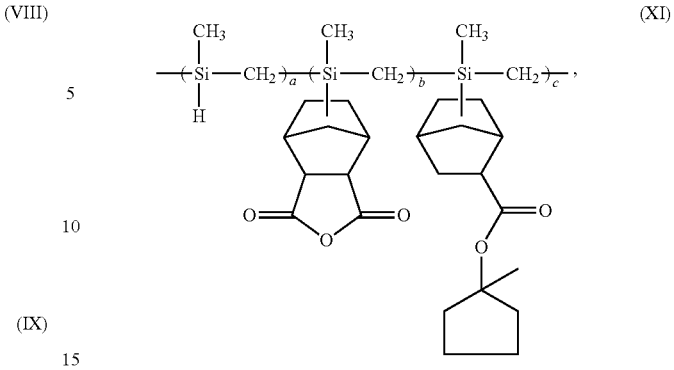

wherein a, b, and c are integers that represent a number of repeat units.

14. The photoresist composition of claim 13, wherein the functionalized carbosilane has a formula given by V.

15. The photoresist composition of claim 13, wherein the functionalized carbosilane has a formula given by VI.

16. The photoresist composition of claim 13, wherein the functionalized carbosilane has a formula given by VII.

17. The photoresist composition of claim 13, wherein the functionalized carbosilane has a formula given by VIII.

18. The photoresist composition of claim 13, wherein the functionalized carbosilane has a formula given by IX.

19. The photoresist composition of claim 13, wherein the functionalized carbosilane has a formula given by X.

20. The photoresist composition of claim 13, wherein the functionalized carbosilane has a formula given by XI.

21. The photoresist composition of claim 1, wherein the carbosilane has an acid labile functionality but not an aqueous base functionality.

22. The photoresist composition of claim 1, wherein the carbosilane has an aqueous base functionality but not an acid labile functionality.

23. The photoresist composition of claim 1, wherein the carbosilane has an acid labile functionality and an aqueous base functionality.

* * * * *